United States Patent
Mukaiyama (10) Patent No.: US 9,553,349 B2
(45) Date of Patent: Jan. 24, 2017

(54) DIRECTIONAL COUPLER

(71) Applicant: MURATA MANUFACTURING CO., LTD., Kyoto (JP)

(72) Inventor: Kazutaka Mukaiyama, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/471,121

(22) Filed: Aug. 28, 2014

(65) Prior Publication Data

US 2014/0368293 A1   Dec. 18, 2014

Related U.S. Application Data

(63) Continuation of application No. PCT/JP2013/055070, filed on Feb. 27, 2013.

(30) Foreign Application Priority Data

Mar. 2, 2012 (JP) ................. 2012-046867

(51) Int. Cl.
   *H01P 5/18* (2006.01)
   *H03H 7/38* (2006.01)
   *H03H 7/48* (2006.01)
   *H01P 3/08* (2006.01)

(52) U.S. Cl.
   CPC .............. *H01P 5/184* (2013.01); *H01P 5/185* (2013.01); *H03H 7/383* (2013.01); *H03H 7/48* (2013.01)

(58) Field of Classification Search
   CPC ............. H01P 5/18; H01P 5/184; H01P 5/185
   USPC ........................ 333/109–112, 116
   See application file for complete search history.

(56) References Cited

U.S. PATENT DOCUMENTS

| | | | | |
|---|---|---|---|---|
| 3,999,150 | A * | 12/1976 | Caragliano et al. | 333/116 |
| 7,218,186 | B2 * | 5/2007 | Chen | 333/116 |
| 7,671,698 | B2 * | 3/2010 | Dupont et al. | 333/116 |
| 7,961,064 | B2 * | 6/2011 | Kearns et al. | 333/109 |
| 8,421,553 | B2 * | 4/2013 | Mukaiyama | 333/109 |
| 8,797,121 | B2 * | 8/2014 | Ezzeddine et al. | 333/116 |

(Continued)

FOREIGN PATENT DOCUMENTS

| CN | 201749928 U | 2/2011 |
|---|---|---|
| JP | H01-274502 A | 11/1989 |

(Continued)

OTHER PUBLICATIONS

International Search Report; PCT/JP2013/055070; May 7, 2013.

(Continued)

*Primary Examiner* — Dean Takaoka
(74) *Attorney, Agent, or Firm* — Studebaker & Brackett PC (57) ABSTRACT

To achieve favorable directivity in a directional coupler, even with a low magnetic-field coupling coefficient, the directional coupler includes a main line, a secondary line, and impedance conversion sections. The main line is connected between a signal input port and a signal output port. The secondary line is coupled to the main line through coupling capacitance and mutual inductance. The impedance conversion sections are connected between the secondary line and a coupling port or an isolation port, and the impedance viewed from the secondary line differs from the impedance viewed from a port side while both impedances viewed from the secondary line are equal.

4 Claims, 7 Drawing Sheets

(56) References Cited

U.S. PATENT DOCUMENTS

| | | |
|---|---|---|
| 2003/0034796 A1 | 2/2003 | Tsujiguchi |
| 2009/0128255 A1* | 5/2009 | Dupont et al. ............... 333/109 |
| 2010/0194489 A1 | 8/2010 | Kearns et al. |
| 2012/0306589 A1 | 12/2012 | Mukaiyama |

FOREIGN PATENT DOCUMENTS

| | | |
|---|---|---|
| JP | H10-126117 A | 5/1998 |
| JP | 2002-280812 A | 9/2002 |
| JP | 2003-133881 A | 5/2003 |
| JP | 2005-124038 A | 5/2005 |
| JP | 2007-194870 A | 8/2007 |
| JP | 2009-044303 A | 2/2009 |
| WO | 2011/102187 A1 | 8/2011 |

OTHER PUBLICATIONS

Written Opinion of the International Searching Authority; PCT/JP2013/055070; May 7, 2013.

An Office Action; "Notice on the First Office Action," issued by the State Intellectual Property Office of the People's Republic of China on Jun. 16, 2015, which corresponds to Chinese Patent Application No. 201380011786.0 and is related to U.S. Appl. No. 14/471,121; with English language translation.

The extended European search report issued by the European Patent Office on Oct. 1, 2015, which corresponds to European Patent Application No. 13754250.2-1811 and is related to U.S. Appl. No. 14/471,121.

* cited by examiner

DIRECTIONAL COUPLER

CROSS REFERENCE TO RELATED APPLICATIONS

This application claims benefit of priority to Japanese Patent Application No. 2012-046867 filed Mar. 2, 2012, and to International Patent Application No. PCT/JP2013/055070 filed Feb. 27, 2013, the entire content of each of which is incorporated herein by reference.

TECHNICAL FIELD

The present technical field relates to directional couplers for use in measurement of high frequency signals and the like, and, in particular, to transmission line type directional couplers.

BACKGROUND

Directional couplers are used for measuring high frequency signals and the like.

Figure 7A:
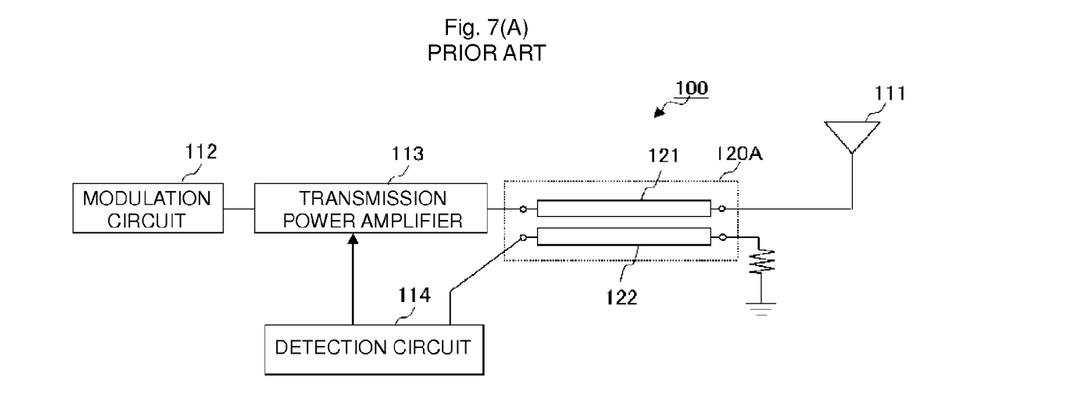
FIGS. 7(A), 7(B) and 7(C) include circuit diagrams illustrating a conventional exemplary configuration of directional coupler.

FIG. 7(A) is a typical block diagram of a radio frequency (RF) transmitter circuit 100 of a cellular phone device or the like. The RF transmitter circuit 100 includes an antenna 111, a directional coupler 120A, a transmission power amplifier 113, a modulation circuit 112, and a detection circuit 114. The directional coupler 120A is of a transmission line type, and includes a main line 121 and a coupling line (secondary line) 122. The main line 121 is connected between the antenna 111 and the transmission power amplifier 113. The detection circuit 114 is connected to the secondary line 122 of the directional coupler 120A and controls the transmission power amplifier 113 based on a signal from the secondary line 122 that couples to the main line 121.

Figure 7B:
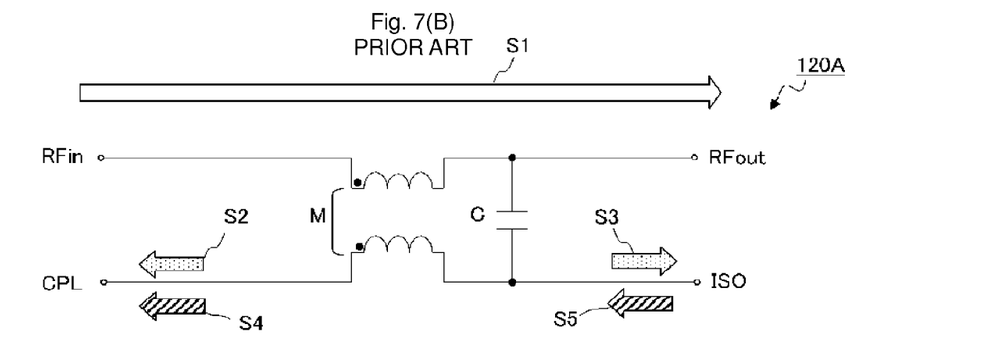
Figure 7C:
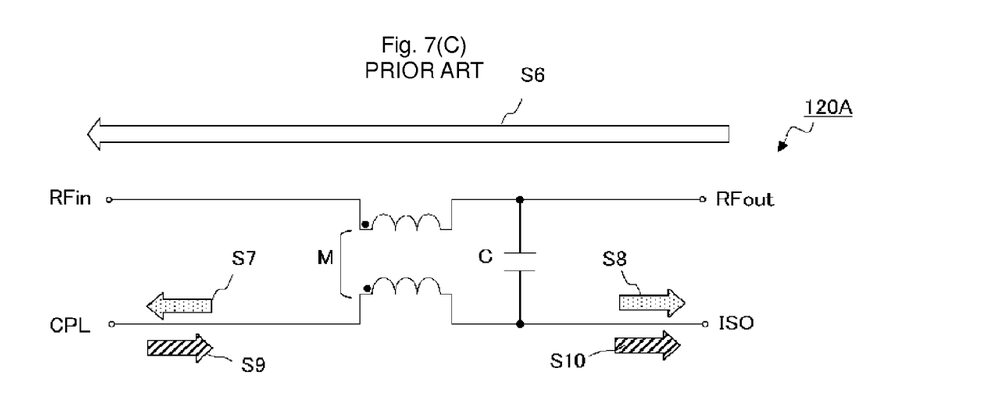

FIG. 7(B) and FIG. 7(C) are equivalent circuit diagrams of the directional coupler 120A. Here, it is assumed that the directional coupler 120A is an ideal circuit in which a magnetic-field coupling coefficient (Km) of a mutual inductance M formed between the main line 121 and the secondary line 122 is equal to one. The main line 121 is connected to a signal input port RFin and a signal output port RFout at its two end portions. The signal input port RFin is connected to the transmission power amplifier 113. The signal output port RFout is connected to the antenna 111. The secondary line 122 is connected to a coupling port CPL and an isolation port ISO at its two end portions. The coupling port CPL is connected to the detection circuit 114. The isolation port ISO is connected to a termination resistor. The main line 121 and the secondary line 122 are electrically coupled to each other through a distributed capacitance (coupling capacitance) C between two lines and magnetically coupled to each other through a mutual inductance M.

As illustrated in FIG. 7(B), when a signal S1 is inputted from the signal input port RFin, electric-field coupling causes a signal S2 to propagate in a direction to the coupling port CPL and a signal S3 to propagate in a direction to the isolation port ISO in the secondary line 122. Further, magnetic-field coupling causes a signal S4 and a signal S5 to propagate in a direction from the isolation port ISO to the coupling port CPL in a closed loop formed of the secondary line 122 and ground (GND). The signals S2 and S4 flowing to the coupling port CPL are aligned in phase. Powers of the signals S2 and S4 are added together, and a resulting signal is outputted from the coupling port CPL. On the other hand, the signals S3 and S5 flowing at the isolation port ISO are in opposite phase. Powers of the signal S3 and the signal S5 cancel out each other at the isolation port ISO. Thus, the output power of the RF transmitter circuit 100 may be detected from the output of the coupling port CPL of the directional coupler 120A.

Further, as illustrated in FIG. 7(C), when a signal S6 is inputted to the signal output port RFout due to reflection from the antenna or the like, the electric-field coupling causes a signal S7 to propagate in a direction to the coupling port CPL and a signal S8 to propagate in a direction to the isolation port ISO in the secondary line 122. Further, the magnetic-field coupling causes a signal S9 and a signal S10 to propagate in a direction from the coupling port CPL to the isolation port ISO. The signals S8 and S10 flowing to the isolation port ISO are aligned in phase. Powers of the signals S8 and S10 are added together, and a resulting signal is outputted from the isolation port ISO. On the other hand, the signals S7 and S9 flowing at the coupling port CPL are in opposite phase. Thus, powers of the signal S7 and the signal S9 cancel out each other at the coupling port CPL. Accordingly, an effect of the signal S6 due to the reflection from the antenna or the like does not reach to the coupling port CPL but reaches only to the isolation port ISO. Typically, the isolation port ISO is connected to a termination resistor. However, recently in some cases, the isolation port ISO has been connected to a detection circuit for detecting the reflection from the antenna and controlling the RF transmitter circuit. Note that, when detecting the reflection from the antenna, names and functions of respective ports (signal input port, signal output port, coupling port, and isolation port) change. However, in the following description, each port name is kept the same as for the transmission signal.

As described above, in the directional coupler for use in a RF communication circuit, the coupling capacitance C corresponds to the electric-field coupling coefficient (Kc), and the mutual inductance M corresponds to the magnetic-field coupling coefficient (Km). In the ideal directional coupler, the electric-field coupling coefficient (Kc) and the magnetic-field coupling coefficient (Km) are both equal to one. Thus, it is possible to cancel out the signal due to the electric-field coupling and the signal due to the magnetic-field coupling completely at the isolation port or the coupling port. However, in an actual directional coupler, there is parasitic inductance due to a peripheral circuit such as routing wiring, wires, or the like, and it is difficult to set the value of the magnetic-field coupling coefficient (Km) to one as described above. Thus, it is hard to cancel out the signal due to the electric-field coupling and the signal due to the magnetic-field coupling completely, and it is difficult to achieve ideal directivity of the directional coupler.

The signal due to the electric-field coupling and the signal due to the magnetic-field coupling may be cancelled out completely at the isolation port or the coupling port by adjusting (decreasing) the electric-field coupling coefficient (Kc) in response to a decrease in the magnetic-field coupling coefficient (Km) of the directional coupler. However, it is necessary to make some changes in physical structure such as widening a line gap between the main line and the secondary line or the like in order to decrease the electric-field coupling coefficient (Kc). Such changes in physical structure may increase the size of the directional coupler or cause a further change or decrease in the magnetic-field coupling coefficient (Km). Thus, the adjustment of the electric-field coupling coefficient (Kc) should be avoided as much as possible.

Figure 8A:
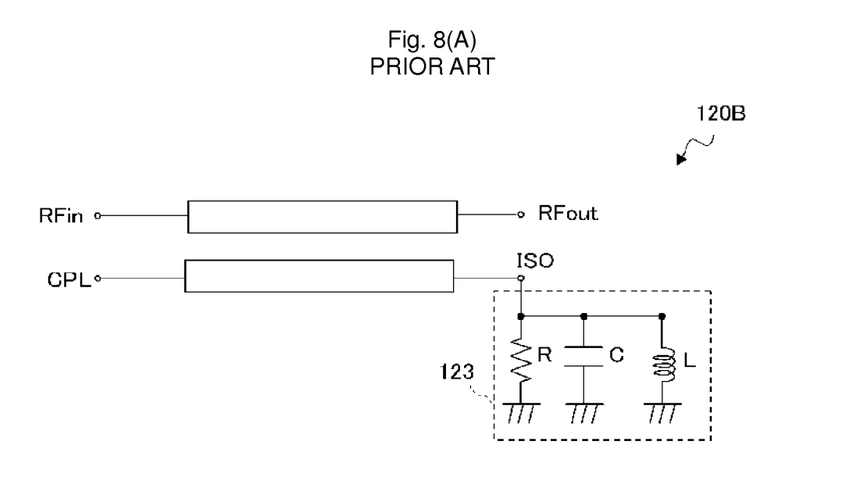
FIGS. 8(A) and 8(B) include circuit diagrams illustrating conventional exemplary configurations of directional coupler.

Therefore, in some cases, a load circuit with an adjustable impedance (for example, see Japanese Unexamined Patent Application Publication No. 01-274502 is used in place of the termination resistor that is to be connected to the isolation port. FIG. 8(A) is a circuit diagram illustrating an exemplary configuration of a directional coupler to which a load circuit is connected. This directional coupler 120B is provided with a load circuit 123 at the isolation port ISO. The load circuit 123 includes a resistor R, an inductance L, and a capacitor C, which are connected in parallel between the isolation port ISO and a ground potential. In this load circuit 123, the impedance may be varied by adjusting the resistor R or the inductance L or the capacitor C. This enables improvement in the directivity of the directional coupler 120B.

Figure 8B:
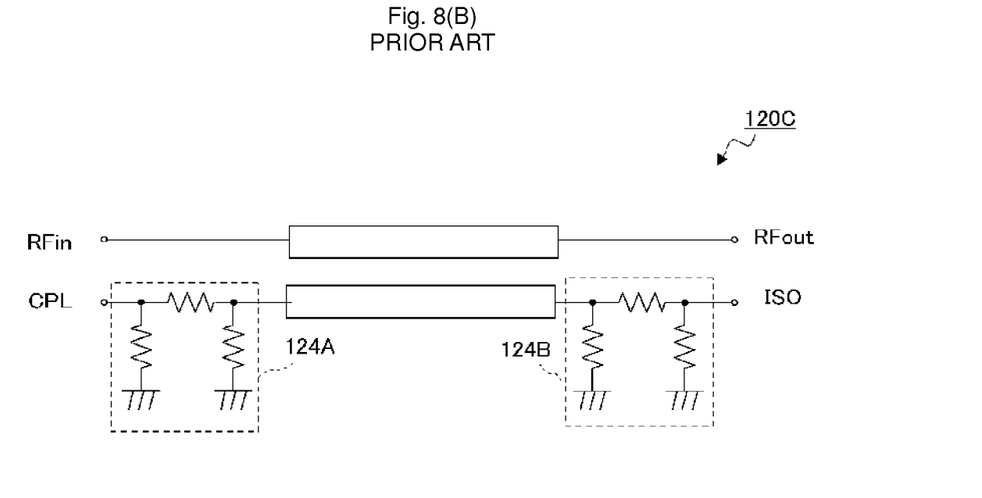

Note that, in some cases, an attenuator is added at the secondary line of the directional coupler (for example, see Japanese Unexamined Patent Application Publication No. 2009-044303). FIG. 8(B) is a circuit diagram illustrating an exemplary configuration of a directional coupler including attenuators. In this directional coupler 120C, attenuators 124A and 124B are connected to the coupling port CPL and the isolation port ISO to remove effects of mismatching at the coupling port CPL and the isolation port ISO.

SUMMARY

Technical Problem

When the directional coupler is provided with a load circuit at the isolation port, the directivity of the directional coupler may be improved for an input signal from the signal input port. However, this prevents the detection of a reflecting signal from the signal output port, and also makes it difficult to change the configuration so as to enable the detection of the reflecting signal.

This is due to the following reasons.

Reason 1) Even if a detection circuit were connected to the isolation port in parallel to the load circuit and this detection circuit has a configuration similar to that of the detection circuit connected to the coupling port, a required power for detecting an antenna reflecting signal may not be obtained at the isolation port due to reflection at the load circuit.

Reason 2) Even if a load circuit were connected to the coupling port in parallel to the detection circuit and this load circuit has a configuration similar to that of the load circuit connected to the isolation port, a required power for detecting the transmission signal may not be obtained at the coupling port due to reflection at the load circuit.

Thus, an object of the present disclosure is to provide a directional coupler capable of detecting both signals from a signal input port and a signal output port and attaining favorable directivity.

Solution to Problem

A directional coupler according to the present disclosure includes a main line, a secondary line, a first impedance conversion section, and a second impedance conversion section. The main line is connected between a signal input port and a signal output port. The secondary line is coupled to the main line through coupling capacitance and mutual inductance. The secondary line is connected between a coupling port and an isolation port. The first impedance conversion section is connected between the coupling port and the secondary line, and impedance viewed from the secondary line differs from impedance viewed from the coupling port. The second impedance conversion section is connected between the isolation port and the secondary line, and impedance viewed from the secondary line differs from impedance viewed from the isolation port.

In this configuration, an inclusion of the first impedance conversion section and the second impedance conversion section allows an apparent load of the secondary line to be varied. The amplitude of a current generated in the secondary line due to the electric-field coupling is independent from the change in this load whereas the amplitude of a current generated in the secondary line due to the magnetic-field coupling varies in response to the change in this load. Thus, proper adjustment of this load enables equalization of the amplitude of a current generated in the secondary line due to the magnetic-field coupling to the current generated in the secondary line due to the electric-field coupling, and to improve the directivity of the directional coupler.

Preferably, in the foregoing directional coupler, the impedance of each impedance conversion section viewed from the secondary line side may be less than impedance viewed from a port side.

Preferably, in the foregoing directional coupler, a ratio of the impedance viewed from the secondary line side to the impedance viewed from the port side may be substantially equal to a ratio of a magnetic-field coupling coefficient to an electric-field coupling coefficient in each impedance conversion section.

Preferably, in the foregoing directional coupler, the main line, the secondary line, the first impedance conversion section, and the second impedance conversion section may be formed by thin film process.

Preferably, the foregoing directional coupler may further include a semi-insulating substrate in which the main line, the secondary line, the first impedance conversion section, and the second impedance conversion section are formed on a same principle surface.

Advantageous Effects of the Disclosure

According to the present disclosure, the apparent load of the secondary line may be adjusted by including the first impedance conversion section and the second impedance conversion section at both end portions of the secondary line and adjusting the impedances viewed from the secondary line in the first impedance conversion section and the second impedance conversion section. The directivity of directional coupler may be improved by properly performing this load adjustment.

DETAILED DESCRIPTION

Hereinafter, an overview of configuration and operation of a directional coupler according to an embodiment of the present disclosure is described.

First Embodiment

Figure 1:
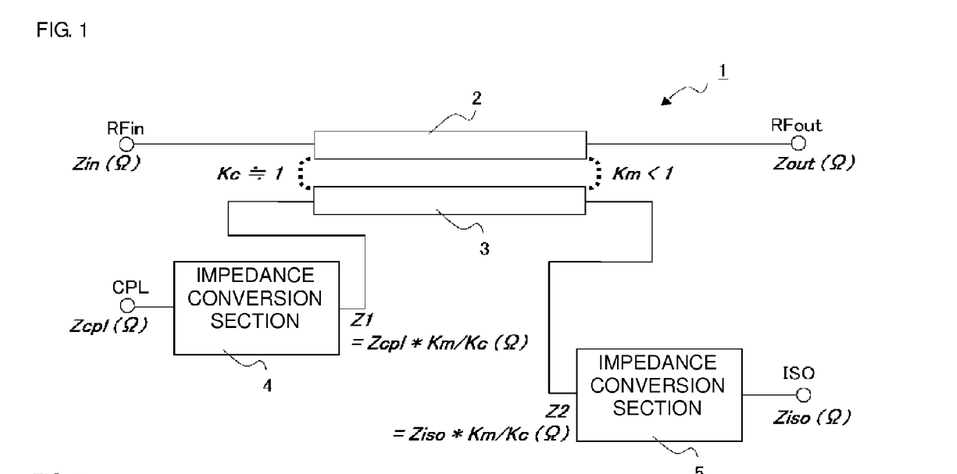
FIG. 1 is a schematic diagram of a directional coupler according to a first embodiment of the present disclosure.

FIG. 1 is a schematic diagram of a directional coupler 1 according to the first embodiment of the present disclosure.

The directional coupler 1 includes, as external connection ports, a signal input port RFin, a signal output port RFout, a coupling port CPL, and an isolation port ISO. When the directional coupler 1 is used in a RF transmitter circuit, the signal input port RFin is connected to a transmission power amplifier. The signal output port RFout is connected to an antenna. The coupling port CPL is connected to a detection circuit or a termination resistor. The isolation port ISO is connected to a termination load or a detection circuit.

Further, the directional coupler 1 includes, as inner elements, a main line 2, a coupling line (secondary line) 3, and impedance conversion sections 4 and 5. The main line 2 is connected between the signal input port RFin and the signal output port RFout. The secondary line 3 is configured so that an electric-field coupling coefficient Kc with the main line 2 becomes approximately equal to one, and capacitively couples with the main line 2 through a distributed capacity (coupling capacity) that is determined in accordance with the electric-field coupling coefficient Kc. Further, the secondary line 3 is configured so that a magnetic-field coupling coefficient Km with the main line 2 becomes less than one, and magnetically couples with the main line 2 through a mutual inductance that is determined in accordance with the magnetic-field coupling coefficient Km.

The impedance conversion section 4 is connected between the coupling port CPL and a first end portion of the secondary line 3. With regard to this impedance conversion section 4, an impedance Z1 viewed from the secondary line 3 side is set to a predetermined value (Zcpl*Km/Kc) that is less than an impedance Zcpl viewed from the coupling port CPL side. The impedance conversion section 5 is connected between the isolation port ISO and a second end portion of the secondary line 3. With regard to the impedance conversion section 5, an impedance Z2 viewed from the secondary line 3 side is set to a predetermined value (Ziso*Km/Kc) that is less than an impedance Ziso viewed from the isolation port ISO side.

In this directional coupler 1, the magnetic-field coupling between the main line 2 and the secondary line 3 causes a current (Im) to flow in the secondary line 3. This current Im corresponds to an apparent load Z (=Z1, Z2) of the secondary line 3 and the magnetic-field coupling coefficient Km that is determined in response to a physical structure such as line widths of the main line 2 and the secondary line 3, a line thickness, a line gap between the main line 2 and the secondary line 3, a peripheral dielectric constant. Specifically, the current Im due to the magnetic-field coupling is determined by the following equation 1, where w is an angular frequency, Km is the magnetic-field coupling coefficient, Mo is a mutual inductance in an ideal circuit where the magnetic-field coupling coefficient Km is equal to one, I is a current on the main line, and Z is the apparent load of the secondary line.

$$Im = j*\omega*Km*Mo*I/(2*Z) \qquad \text{Equation 1}$$

In other words, the current Im due to the magnetic-field coupling varies depending on the apparent load Z of the secondary line.

Further, the electric-field coupling between the main line 2 and the secondary line 3 causes a current (Ic) to flow in the secondary line 3. This current Ic corresponds to the electric-field coupling coefficient Kc that is determined in response to the physical structure such as the line widths of the main line 2 and the secondary line 3, the line thickness, the line gap between the main line 2 and the secondary line 3, the peripheral dielectric constant. Specifically, the current Ic due to the electric-field is determined by the following equation 2, where ω is the angular frequency, Kc is the electric-field coupling coefficient, Co is the coupling capacitance in an ideal circuit where the electric-field coupling coefficient Kc is equal to one, and V is a voltage of the main line.

$$Ic = j*\omega*Kc*Co*V/2 \qquad \text{Equation 2}$$

In other words, the current Ic due to the electric-field coupling is determined independently from the apparent load Z of the secondary line.

For a signal to be inputted from the signal input port RFin (a transmission signal at the RF transmitter circuit), the current Im and the current Ic are in phase at the coupling port CPL, and their amplitudes are added together. At the isolation port ISO, on the other hand, the current Im and the current Ic are in opposite phase, and their amplitudes cancel out each other.

Further, for a signal to be inputted from the signal output port RFout (antenna reflecting signal at the RF transmitter circuit), the current Im and the current Ic are in phase at the isolation port ISO, and their amplitudes are added together. At the coupling port CPL, on the other hand, the current Im and the current Ic are in opposite phase, and their amplitudes cancel out each other.

The current Im needs to be equal to the current Ic in amplitude to completely cancel out the current Im and the current Ic at the isolation port ISO or the coupling port CPL. To achieve this, the following equation 3 based on the equation 1 and the equation 2 needs to hold.

$$Im/Ic = j*\omega*Km*Mo*I/(2*Z)/((j*\omega*Kc*Co*V)/2) = Km*Mo*I/(Z*Kc*Co*V) = 1 \qquad \text{Equation 3}$$

When assuming that the directional coupler is an ideal directional coupler without the impedance conversion sections 4 and 5 and the magnetic-field coupling coefficient Km and the electric-field coupling coefficient Kc are both equal to one, the following equation 4 based on the equation 3 holds for the ratio between the current Im and the current Ic, where Zo is an apparent load of the secondary line 3 in this case.

$$Im/Ic = Mo*I/(Co*V*Zo) = 1 \qquad \text{Equation 4}$$

That is, the following equation 5 holds.

$$Mo*I/(Co*V) = Zo \qquad \text{Equation 5}$$

Further, when the equation 5 is substituted into the equation 3, the following equation 6 holds.

$$Im/Ic = Km*Mo*I/(Kc*Co*V*Z) = (Km/Kc)/(Z/Zo) \qquad \text{Equation 6}$$

Accordingly, in this directional coupler 1, the current Im and the current Ic may become equal to each other by setting a ratio (Z/Zo) equal to a ratio (Km/Kc) of the magnetic-field coupling coefficient to the electric-field coupling coefficient, where Z is the apparent load of the secondary line when the impedance conversion sections 4 and 5 are included, and Zo is the load of the secondary line in the ideal circuit without the impedance conversion sections 4 and 5.

This ratio (Z/Zo) is equivalent to a ratio of the impedance (Z1, Z2) viewed from the secondary line 3 side to the impedance (Zcpl, Ziso) viewed from the port side for the impedance conversion section 4, 5. Accordingly, by adjusting the impedances (Z1, Z2) of the impedance conversion sections 4 and 5 viewed from the secondary line 3 side to preset values (Zcpl*Km/Kc and Ziso*Km/Kc), the current Im due to the magnetic-field coupling may be adjusted so as to become equal to the current Ic due to the electric-field coupling in amplitude independently from the current Ic, irrespective of the value of the magnetic-field coupling coefficient Km. Therefore, the directivity of the directional coupler 1 may be improved.

Second Embodiment

Figure 2:
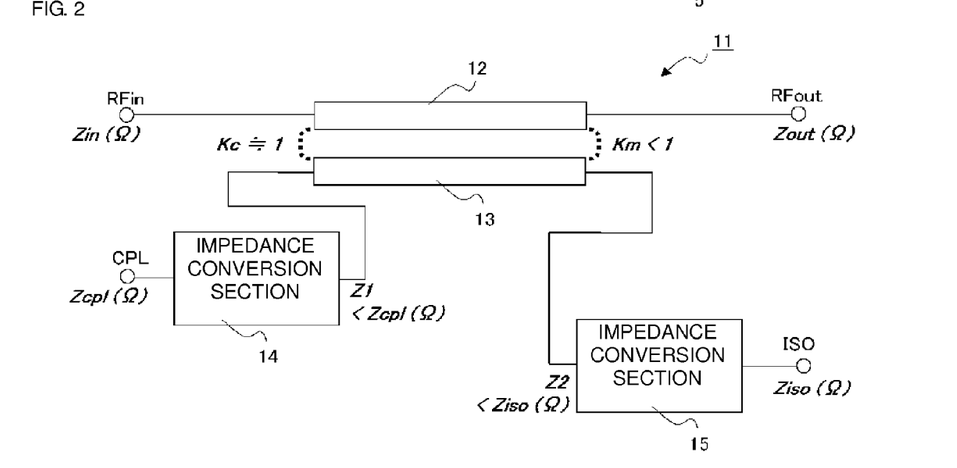
FIG. 2 is a schematic diagram of a directional coupler according to a second embodiment of the present disclosure.

FIG. 2 is a schematic diagram of a directional coupler 11 according to the second embodiment of the present disclosure.

This directional coupler 11 includes, as inner elements, a main line 12, a secondary line 13, and impedance conversion sections 14 and 15. The directional coupler 11 has a configuration similar to that of the directional coupler illustrated in the first embodiment except an apparent load of the secondary line 13 that differs from its counterpart. Specifically, an impedance (Z1) of the impedance conversion section 14 viewed from the secondary line 13 side is smaller than an impedance (Zcpl) of the impedance conversion section viewed from the coupling port CPL side. Further, an impedance (Z2) of the impedance conversion section 15 viewed from the secondary line 13 side is smaller than an impedance (Ziso) of the impedance conversion section 15 viewed from the isolation port ISO side.

Even in the foregoing configuration, a decrease in the current Im due to a magnetic-field coupling coefficient Km of less than one may be compensated for by an increase of the current Im due to reductions in the apparent loads Z (Z1, Z2) of the secondary line. Thus, compared with the case where the impedance conversion sections 14 and 15 are not included, the directivity of the directional coupler 11 may be improved.

EXAMPLE

In the following section, an example is described. The example employs a resistor circuit in which resistors are connected in letter "L" shape as the impedance conversion section. Note that other configurations may also be employed as the impedance conversion section. The other configuration may be, for example, a resistor circuit in which resistors are connected in "π" shape or letter "T" shape and arranged so that resistance values of the respective resistors are arranged asymmetrically.

Figure 3:
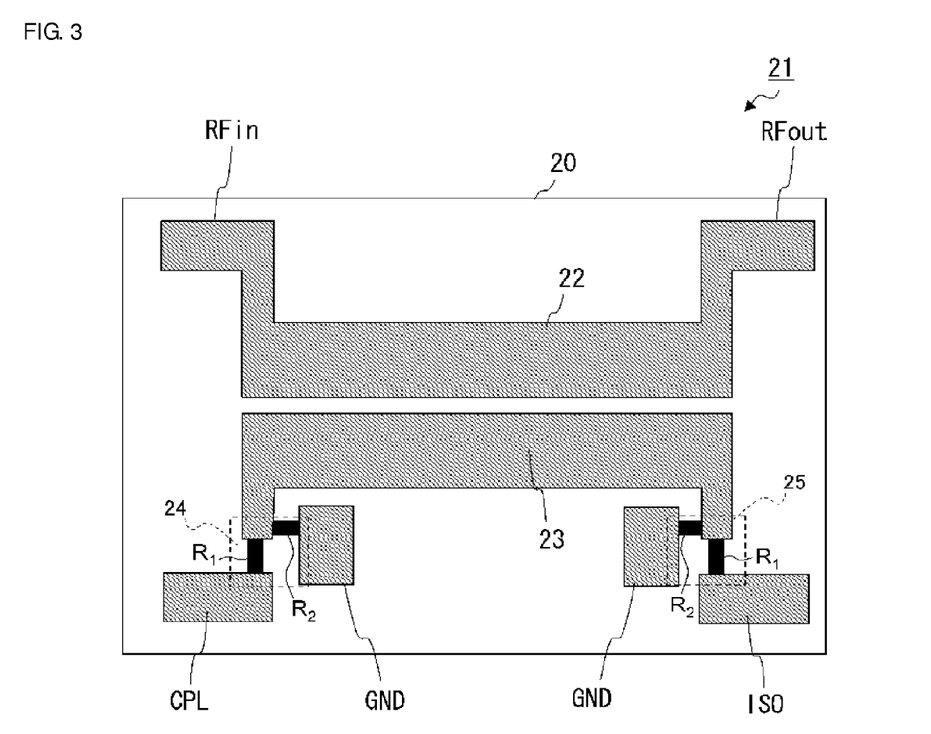
FIG. 3 is a plan view illustrating an exemplary configuration of a directional coupler according to an example of the present disclosure.
Figure 4A:
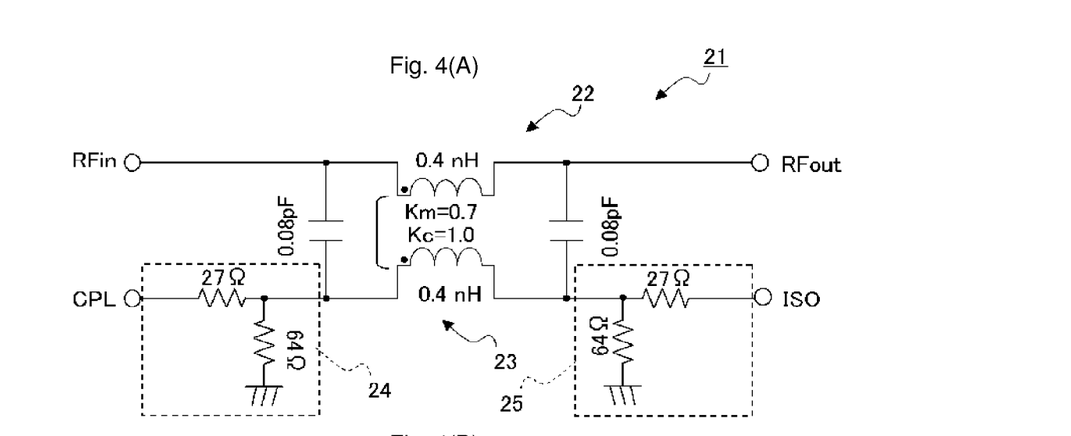
FIGS. 4(A), 4(B) and 4(C) describe an equivalent circuit of a directional coupler according to an example of the present disclosure.

FIG. 3 is a plan view of a directional coupler 21 according to an example of the present disclosure. FIG. 4(A) is an equivalent circuit diagram of the directional coupler 21.

As illustrated in FIG. 3, the directional coupler 21 includes a semi-insulating GaAs substrate 20. On a principle surface of the GaAs substrate 20, a main line 22, a secondary line 23, a signal input electrode (signal input port) RFin, a signal output electrode (signal output port) RFout, a coupling electrode (coupling port) CPL, an isolation electrode (isolation port) ISO, a ground electrode GND, and high resistance lines R1 and R2 are formed. The main line 22 and the secondary line 23 are formed so that length directions thereof are directed in a same direction and extend side by side. The signal input electrode RFin is formed so as to connect to one end portion of the main line 22. The signal output electrode RFout is formed so as to connect to the other end portion of the main line 22. The coupling electrode CPL is formed so as to connect to one end portion of the secondary line 23 through the high resistance line R1. The isolation electrode ISO is connected to the other end portion of the secondary line 23 through the high resistance line R1. The ground electrode GND is connected to each end portion of the secondary line 23 through the high resistance line R2.

This directional coupler 21 is formed by a semiconductor thin film process that uses the GaAs substrate 20 in a wafer shape. In the semiconductor thin film process, after forming electrode members on the wafer by evaporation, sputtering, plating, or the like, a resist film is formed by a photolithography process, and unnecessary electrode members are removed by etching. Alternatively, a resist film pattern may be formed first by the photolithography process, and then electrode members may be deposited at portions other than the resist film pattern by evaporation, sputtering, plating, or the like. Finally, an electrode pattern is formed by lifting the resist film off.

Specifically, on the GaAs substrate 20 in a wafer shape, the high resistance lines R1 and R2 that form a plurality of directional couplers 21 are formed at the same time. Subsequently, the main lines 22, the secondary lines 23, the signal input electrodes RFin, the signal output electrodes RFout, the coupling electrodes CPL, the isolation electrodes ISO, and the ground electrodes GND, which constitute the plurality of directional couplers 21, are formed at the same time. The plurality of directional couplers 21 is manufactured at once by wafer separation.

Manufacturing the directional coupler 21 by using the foregoing semiconductor thin film process enables achieving extremely high accuracy in forming each electrode, thereby making it possible to constantly achieve even an extremely small coupling amount or isolation output characteristic such as −30 dB to −60 dB for an input power. Accordingly, the directional couplers 21 may be achieved at high yield. Further, in the case where the semiconductor thin film process is to be used, loss at the substrate becomes large when a typical Si substrate is used. This increases the insertion loss of the directional coupler 21. However, the use of a semi-insulating substrate such as GaAs substrate enables to reduce the insertion loss. Further, in addition to the directional coupler, another active element may be mounted on the semi-insulating substrate together to promote device downsizing, cost reduction, or the like.

As illustrated in FIG. 4(A), the directional coupler includes impedance conversion sections 24 and 25. The impedance conversion sections 24 and 25 are each a resistor circuit in which the high resistance lines R1 and R2 are connected in letter L shape, and each have an impedance conversion function as well as a function of an attenuator.

Here, it is assumed that an inductance that forms the main line 22 and an inductance that forms the secondary line 23 are both 0.4 nH and the magnetic-field coupling coefficient between two inductances is 0.7. Further, the capacitance formed between the main line 22 and the secondary line 23 is 0.08 pF and is arranged at both end sides of the inductance, and the electric-field coupling coefficient is 1.0. The resistance formed of the high resistance line R1 is 27 Ω, and the resistance formed of the high resistance line R2 is 64 Ω.

The foregoing numerical settings allow the apparent impedance Z viewed from the secondary line 23 side to be about 35 Ω and the impedance ratio Z/Zo to be about 0.7 when the load Zo that is to be connected to the CPL port and ISO port is 50 Ω. In other words, the impedance ratio Z/Zo becomes substantially equal to the ratio 0.7 between the magnetic-field coupling coefficient Km and the electric-field coupling coefficient Kc. Accordingly, in this directional coupler 21, the current generated at the secondary line 23 by electric-field coupling and the current generated at the secondary line 23 by magnetic-field coupling become substantially equal in amplitude, thereby making it possible to achieve favorable directivity.

Figure 4B:
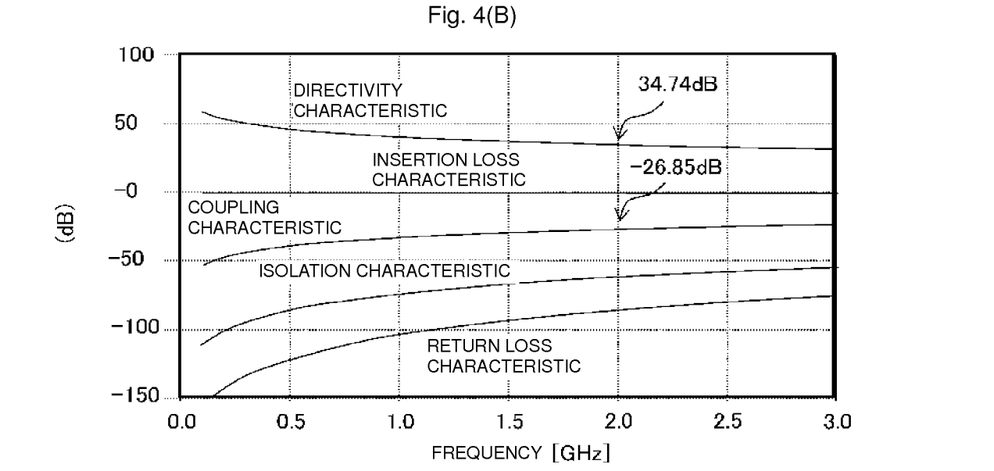
Figure 4C:
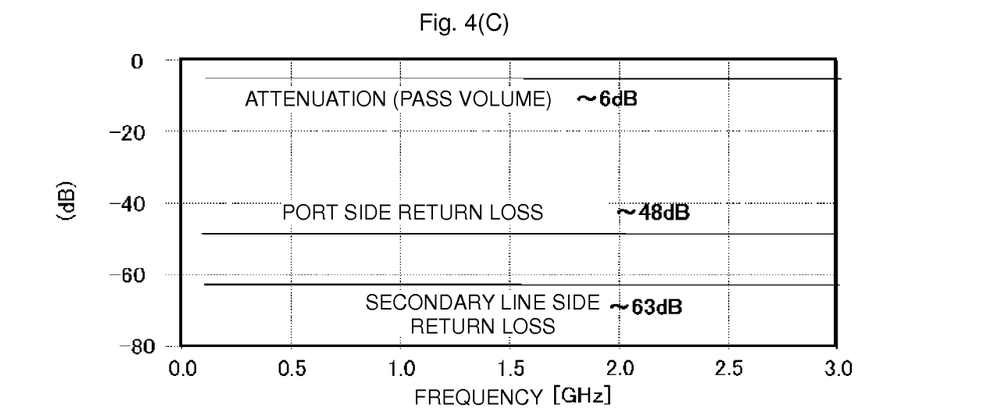

FIG. 4(C) is a diagram illustrating characteristics of the impedance conversion section 24, 25 based on a simulation. This configuration of the impedance conversion section 24, 25 allows the impedance conversion section 24, 25 to also function as an attenuator that provides an attenuation of −6 dB.

Figure 5A:
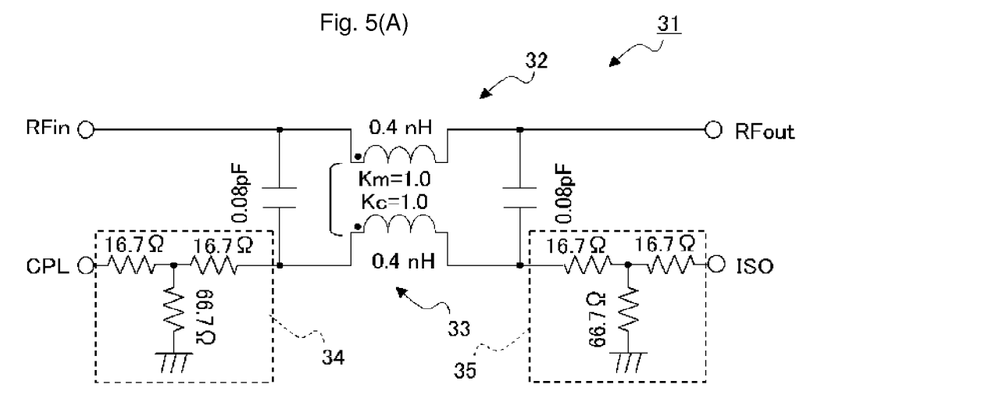
FIGS. 5(A) and 5(B) describe an equivalent circuit of a directional coupler to be compared with the example.
Figure 6A:
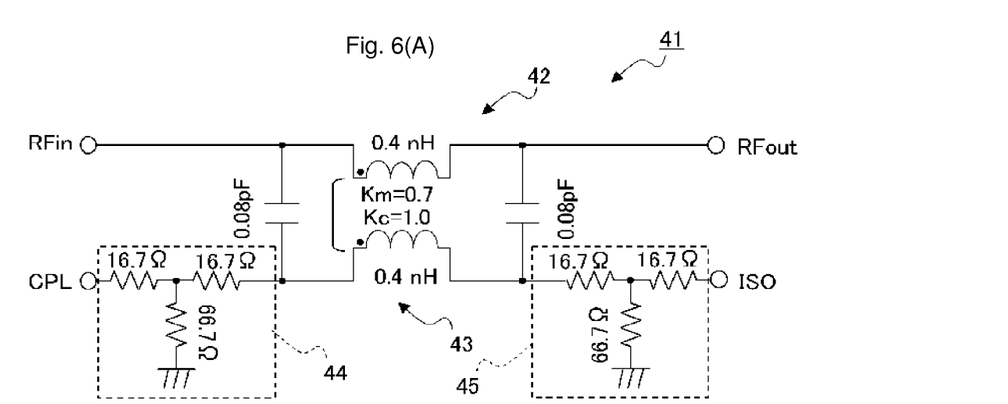
FIGS. 6(A) and 6(B) describe an equivalent circuit of a directional coupler to be compared with the example.

Differences in output characteristics between the present example and comparison examples are now described. FIG. 5(A) is an equivalent circuit diagram of a directional coupler 31 according to a first comparison example. FIG. 6(A) is an equivalent circuit diagram of a directional coupler 41 according to a second comparison example.

The directional coupler 31 is an ideal circuit in which the electric-field coupling coefficient Kc and the magnetic-field coupling coefficient Km are both equal to one, and is configured to include typical −6 dB attenuators at both end portions of the secondary line. Further, the directional coupler 41 is configured so that the electric-field coupling coefficient Kc is one whereas the magnetic-field coupling coefficient Km is 0.7, and is configured to include typical −6 dB attenuators at both end portions of the secondary line.

Figure 5B:
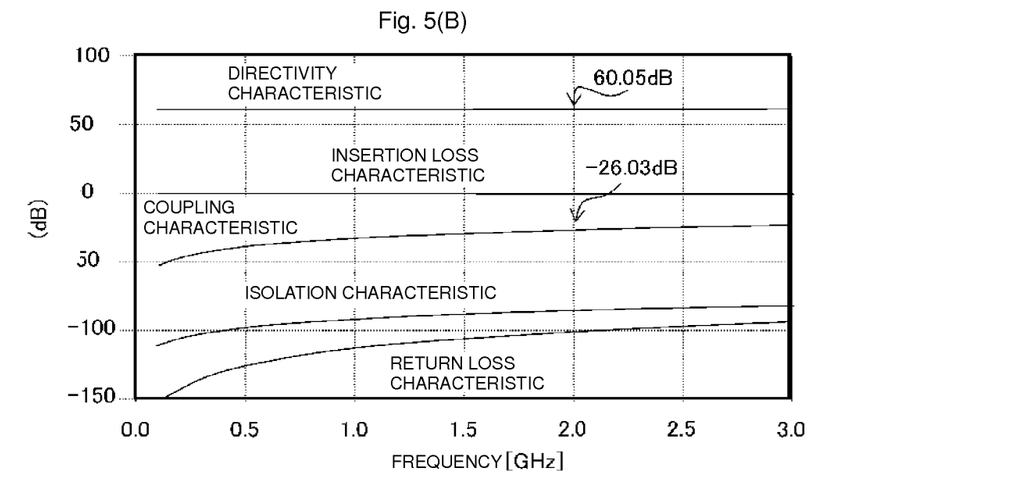
Figure 6B:
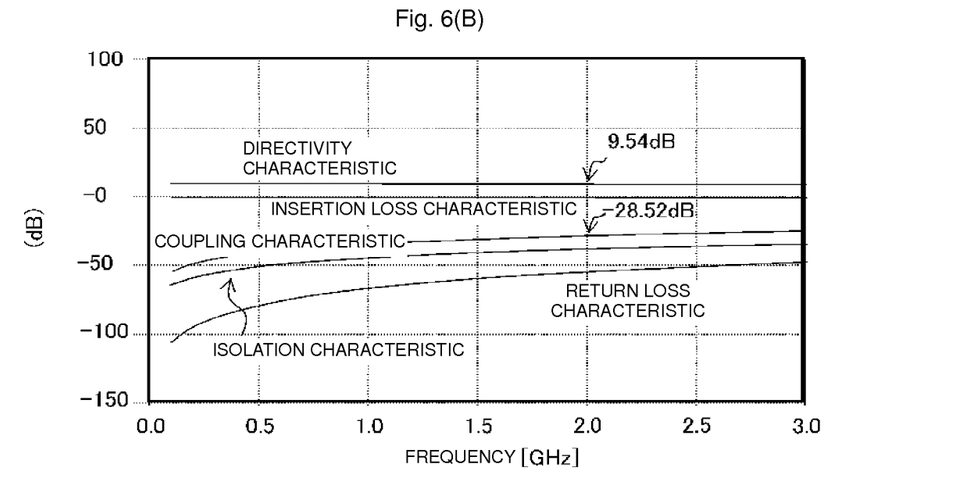

FIG. 4(B) is a diagram illustrating output characteristics of the directional coupler 21 according to the present example based on a simulation. FIG. 5(B) is a diagram illustrating output characteristics of the directional coupler according to the first comparison example based on simulation. FIG. 6(B) is a diagram illustrating output characteristics of the directional coupler 41 according to the second comparison example based on simulation.

Note that the coupling characteristic indicated in the figures refers to a frequency characteristic of coupling degree between the signal input port RFin and the coupling port CPL. The isolation characteristic refers to a frequency characteristic of coupling degree (isolation) between the signal input port RFin and the isolation port ISO. The insertion loss characteristic refers to a frequency characteristic of coupling degree (coupling loss) between the signal input port RFin and the signal output port RFout. The return loss characteristic refers to a frequency characteristic of coupling degree (insertion loss) between input and output at the signal input port RFin. The directivity characteristic refers to a frequency characteristic corresponding to a difference between the isolation characteristic and the coupling characteristic.

In the directional coupler 31 that serves as an ideal circuit, the directivity at about 2 GHz is 60.05 dB, and the coupling amount in the coupling characteristic is −26.03 dB. On the other hand, in the directional coupler 41 that serves as a conventional circuit, the directivity at 2 GHz is 9.54 dB, and the coupling amount in the coupling characteristic is −28.52 dB. In the directional coupler 21 according to the present example, the directivity at 2 GHz is 34.74 dB, and the coupling amount in the coupling characteristic is −26.85 dB. As described above, the directional coupler 31 that serves as an ideal circuit achieves high directivity whereas the directional coupler 41 that serves as a conventional circuit achieves only low directivity. On the other hand, the directional coupler 21 according to the present example achieves relatively high directivity despite its magnetic-field coupling coefficient Km similar to that of the directional coupler 41 that serves as a conventional circuit.

As described above, it turns out that the configuration of the present example allows the apparent load of the secondary line 23 to be adjusted even with a decreased magnetic-field coupling coefficient km by having the impedance conversion sections, and enables improvement of the directivity of the directional coupler in the end.

The present disclosure may be implemented as described in the foregoing embodiments and the example. However, the scope of the present disclosure should not be limited to the description of the foregoing embodiments. The scope of the present disclosure is described by the scope of the claims, and all variations which come within the meaning and range of equivalency of the claims are therefore intended to be embraced therein.

The invention claimed is:

1. A directional coupler comprising:
a main line connected between a signal input port and a signal output port;
a secondary line coupled to the main line through coupling capacitance and mutual inductance and connected between a coupling port and an isolation port;
a first impedance conversion section provided between the coupling port and the secondary line and configured to perform impedance conversion; and
a second impedance conversion section provided between the isolation port and the secondary line and configured to perform impedance conversion, wherein
in the first impedance conversion section, an impedance viewed from a secondary line side differs from an impedance viewed from a coupling port side,
in the second impedance conversion section, impedance viewed from the secondary line differs from impedance viewed from the isolation port side,
in the first impedance conversion section, a ratio of impedance viewed from the secondary line side to impedance viewed from the coupling port side is substantially equal to a ratio of a magnetic-field coupling coefficient to an electric-field coupling coefficient, and
in the second impedance conversion section, a ratio of impedance viewed from the secondary line side to impedance viewed from the isolation port side is substantially equal to the ratio of the magnetic-field coupling coefficient to the electric-field coupling coefficient.

2. The directional coupler according to claim 1, wherein
in the first impedance conversion section, an impedance viewed from the secondary line side is less than an impedance viewed from the coupling port side, and
in the second impedance conversion section, an impedance viewed from the secondary line side is less than an impedance viewed from the isolation port side.

3. The directional coupler according to claim 1, wherein the main line, the secondary line, the first impedance conversion section, and the second impedance conversion section are embodied as thin films on a substrate.

4. The directional coupler according to claim 1, further comprising:
a semi-insulating substrate in which the main line, the secondary line, the first impedance conversion section, and the second impedance conversion section are formed on a same principle surface.

* * * * *